US010553293B2

(12) United States Patent
Hsu

(10) Patent No.: US 10,553,293 B2
(45) Date of Patent: Feb. 4, 2020

(54) 3D NAND ARRAY WITH DIVIDED STRING ARCHITECTURE

(71) Applicant: Fu-Chang Hsu, San Jose, CA (US)

(72) Inventor: Fu-Chang Hsu, San Jose, CA (US)

( * ) Notice: Subject to any disclaimer, the term of this patent is extended or adjusted under 35 U.S.C. 154(b) by 0 days.

(21) Appl. No.: 16/138,897

(22) Filed: Sep. 21, 2018

(65) Prior Publication Data
US 2019/0027227 A1 Jan. 24, 2019

Related U.S. Application Data

(62) Division of application No. 15/348,869, filed on Nov. 10, 2016, now abandoned.

(60) Provisional application No. 62/253,683, filed on Nov. 11, 2015.

(51) Int. Cl.
| | |
|---|---|
| *G11C 16/34* | (2006.01) |
| *H01L 49/02* | (2006.01) |
| *G11C 16/04* | (2006.01) |
| *G11C 16/10* | (2006.01) |
| *H01L 27/11524* | (2017.01) |
| *H01L 27/1157* | (2017.01) |

(52) U.S. Cl.
CPC .......... *G11C 16/3427* (2013.01); *G11C 16/04* (2013.01); *G11C 16/10* (2013.01); *H01L 27/1157* (2013.01); *H01L 27/11524* (2013.01); *H01L 28/00* (2013.01); *G11C 16/0466* (2013.01)

(58) Field of Classification Search
None
See application file for complete search history.

(56) References Cited

U.S. PATENT DOCUMENTS

| | | | |
|---|---|---|---|
| 6,285,587 | B1 | 9/2001 | Kwon |
| 6,295,227 | B1 | 9/2001 | Sakui et al. |
| 6,850,439 | B1 | 2/2005 | Tanaka |
| 8,908,431 | B2 | 12/2014 | Shim et al. |
| 2004/0145024 | A1 | 7/2004 | Chen et al. |
| 2005/0056869 | A1 | 3/2005 | Ichige et al. |

(Continued)

OTHER PUBLICATIONS

International Search Report, dated Jan. 26, 2017, for corresponding International Application No. PCT/US2016/061430.

(Continued)

*Primary Examiner* — Douglas King
(74) *Attorney, Agent, or Firm* — Intellectual Property Law Group LLP

(57) ABSTRACT

A 3D NAND array with divided string architecture. In one aspect, an apparatus includes a plurality of charge storing devices connected to form a cell string. The apparatus also includes one or more internal select gates connected between selected charge storing devices in the cell string. The one or more internal select gates divide the cell string into two or more segments of charge storing devices. Selectively enabling and disabling the one or more internal select gates during programming operates to isolate one or more selected segments to reduce program-disturb to remaining segments. In another embodiment, a method is provided for programming a memory cell of a cell string having internal select gates that isolate the memory cell to reduce the effects of program-disturb. In another embodiment, multiple memory cells of a cell string having internal select gates are programmed with reduced program-disturb.

13 Claims, 10 Drawing Sheets

(56) References Cited

U.S. PATENT DOCUMENTS

| | | |
|---|---|---|
| 2007/0099381 A1 | 5/2007 | Walker |
| 2008/0159002 A1 | 7/2008 | Dong et al. |
| 2009/0097309 A1 | 4/2009 | Mizukami et al. |
| 2010/0054036 A1 | 3/2010 | Lee et al. |
| 2014/0098606 A1 | 4/2014 | Yip |
| 2014/0307508 A1 | 10/2014 | Rhie |
| 2015/0078077 A1* | 3/2015 | Kanda ................ G11C 16/24 365/185.2 |
| 2016/0071599 A1* | 3/2016 | Hsu ................ G11C 16/10 365/185.12 |

OTHER PUBLICATIONS

Written Opinion of the International Searching Authority, dated Jan. 26, 2017, for corresponding International Application No. PCT/US2016/061430.

* cited by examiner

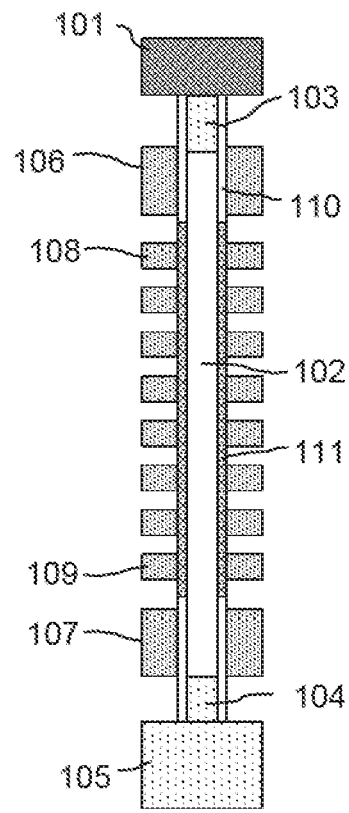
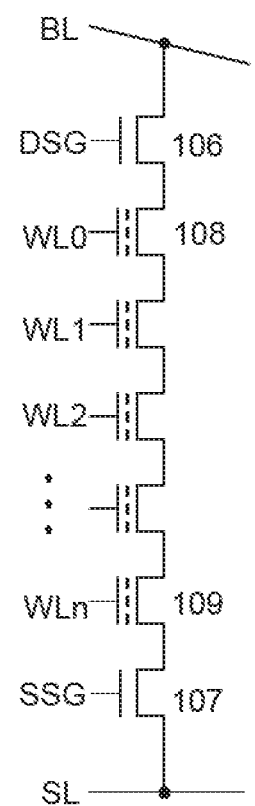
FIG. 1
(Prior Art)
FIG. 2
(Prior Art)

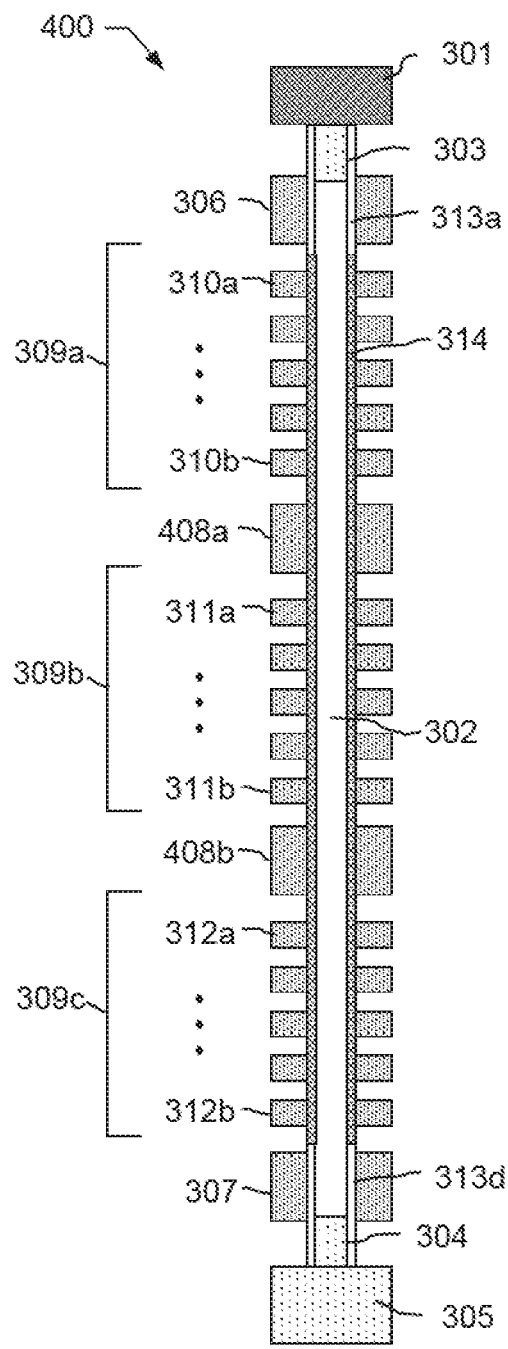
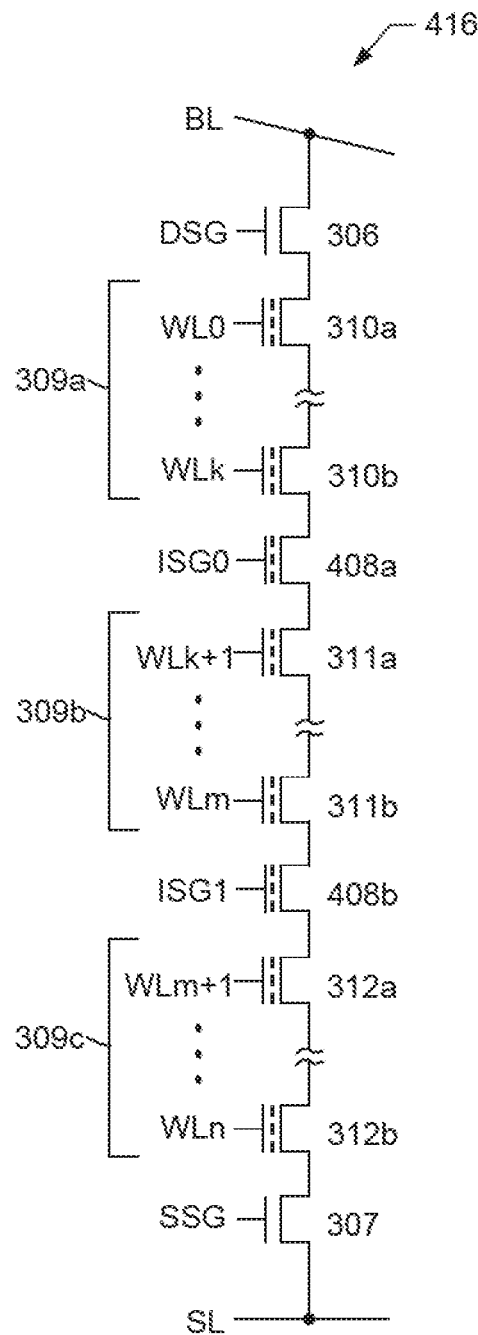
FIG. 4A
FIG. 4B

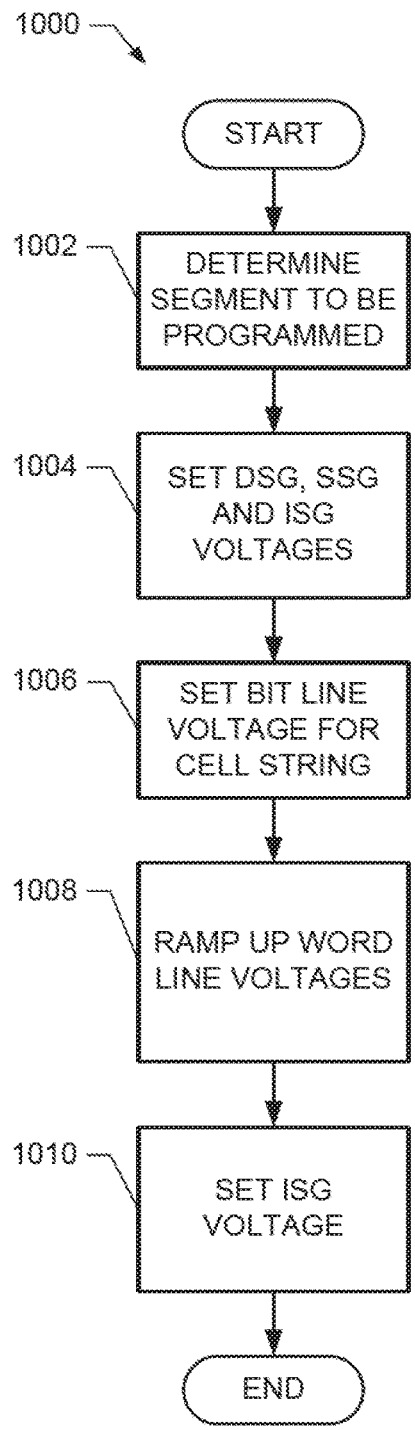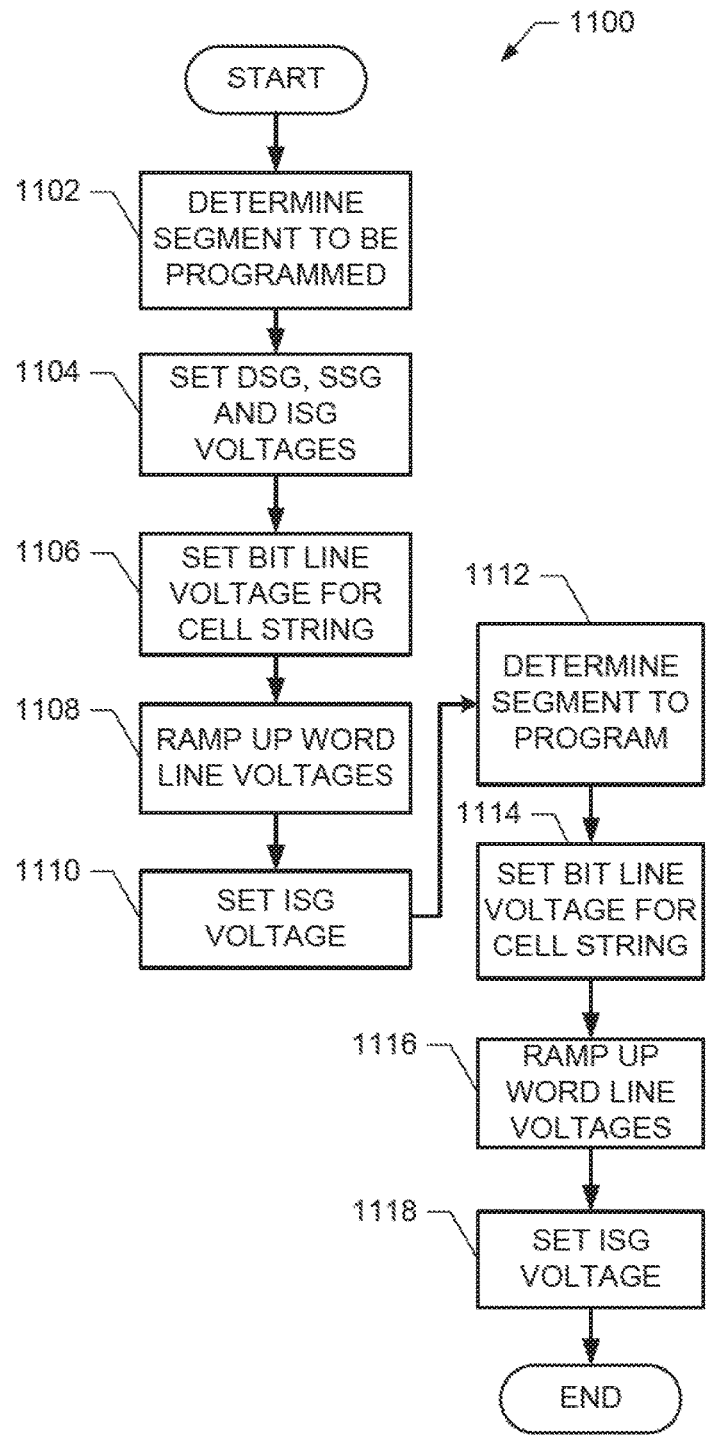
FIG. 10
FIG. 11

3D NAND ARRAY WITH DIVIDED STRING ARCHITECTURE

PRIORITY

This application is a divisional of a U.S. patent application having application Ser. No. 15/348,869, filed on Nov. 10, 2016, and entitled "3D NAND ARRAY WITH DIVIDED STRING ARCHITECTURE," which further claims the benefit of priority based upon U.S. Provisional patent application having Application No. 62/253,683, filed on Nov. 11, 2015, and entitled "3D NAND ARRAY WITH DIVIDED STRING ARCHITECTURE," all of which are hereby incorporated herein by reference in their entirety.

FIELD OF THE INVENTION

The exemplary embodiments of the present invention relate generally to the field of semiconductors and integrated circuits, and more specifically to memory and storage devices.

BACKGROUND OF THE INVENTION

Memory devices are widely used in a variety of digital electronics. One type of memory device is a dynamic random access memory (DRAM) device. DRAM devices can be used to form low cost high density memory arrays. For example, one of the largest applications for DRAM is as the main memory in modern computers. Unfortunately, due to the dynamic nature of its configuration, the information stored in DRAM will eventually degrade unless periodic memory refresh cycles are performed. Thus, though DRAM memory cells may be small in size, they may also consume large amounts of power due to the refresh requirements.

Another type of memory device is a non-volatile memory (NVM) device that has long data retention without the use of refresh cycles. This memory may also be referred to as static memory. In contrast to DRAM, NVM memory devices maybe more expensive but consume less power. Some examples of non-volatile memory include read-only memory (ROM) and Flash memory.

System designers therefore need to select the appropriate memory type for the systems they are designing. This means accounting for the trade-offs between size, cost, speed, power consumption, and volatility of the different memory types. In some cases, more resources (e.g., size and cost) are allocated for memory where multiple types of memory are needed to obtain the desired memory characteristics.

FIG. 1 shows a cross-section view of a conventional 3D NAND cell string 100 for use in a flash memory array. The cell string 100 includes a metal bit line 101 and a polysilicon or silicon channel 102. The cell string 100 also includes source 103 and drain 104 regions that may have the opposite types of doping. A silicon source line 105, a drain select gate (DSG) 106 and source select gate (SSG) 107 are also included. Memory cells are formed where word lines (WL0-WLn) (e.g., 108 and 109) intersect with a charge-trapping layer. For example, the cell string 100 also includes a gate oxide layer 110 and a charge-trapping layer 111, such as an Oxide-Nitride-Oxide (ONO) layer that traps electric charge to represent the cell's data. FIG. 2 shows a circuit representation of the 3D NAND cell string 100.

One significant drawback of conventional 3D NAND array structures that utilize the architecture of the cell string 100 is that of "program-disturb." During programming, a selected word line (e.g., WL0) is supplied with a high voltage, such as +10V to +20V. All the unselected word lines (e.g., WL1-WLn) are supplied with a medium high voltage, such as +5V to +10V. This will boost the channel 102 of the cells to about +5V to +10V to program-inhibit the cell. However, this condition will cause significant program-disturb to some or all of the cells associated with the unselected word lines.

Furthermore, as the density of the 3D NAND array is increased, more word line layers will be stacked in one string, and thus the problem of program-disturb is increased. This problem will become even more severe for Multi-Level Cell (MLC) configurations because each level has a narrower voltage threshold (Vt) window.

Thus, the program-disturb problem has become a technical challenge for increasing the density of 3D NAND memory. It is therefore desirable to have a mechanism that overcomes the problem of program-disturb associated with convention memory arrays.

SUMMARY

A novel 3D NAND array with divided string architecture is disclosed to address the issue of program-disturb in 3D memory arrays. In various exemplary embodiments, the divided string architecture enables more layers to be stacked in a 3D array without increasing the risk of program-disturb.

In various exemplary embodiments, the divided string architecture includes internal select gates within the cell string that divide the cell string into segments. Each segment contains a selected number of memory cells. During programming, the internal select gates can be enabled or disabled to isolate selected segments of the cell string. When programming an isolated segment, the problem of program-disturb for the remaining segments is reduced or eliminated. Thus, even with memory cell strings having many layers, the effects of program-disturb can be mitigated. In addition to the novel cell structure, several novel programming bias conditions are disclosed that allow programming of cells in one or multiple segments while reducing or eliminating the effects of program-disturb on the remaining segments of the cell string.

In one aspect, an apparatus is provided that includes a plurality of charge storing devices connected to form a cell string. The apparatus also includes one or more internal select gates connected between selected charge storing devices in the cell string. The one or more internal select gates divide the cell string into two or more segments of charge storing devices. Selectively enabling and disabling the one or more internal select gates during programming operates to isolate one or more selected segments to reduce program-disturb to remaining segments.

In one aspect, a method is provided for programming memory cells of a cell string having internal select gates that divides the cell string into segments. The method includes identifying a segment of the cell string containing a memory cell to be programmed and applying a first voltage to a source selected gate of the cell string. The method also includes applying a second voltage to a drain select gate and the internal select gates of the cell string, and applying a third voltage to a bit line of the cell string. The method also includes ramping up a fourth voltage to a selected word line of the segment, and ramping up a fifth voltage to unselected word lines of the segment.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

FIGS. 1-2 show a conventional 3D NAND cell string and an equivalent circuit;

FIGS. 4A-B show exemplary embodiments of a divided linear cell string structure and an equivalent circuit in accordance with the present invention;

FIG. 10 shows an exemplary embodiment of method for programming a single memory element in a single segment in a cell string with reduced program-disturb;

FIG. 11 shows an exemplary embodiment of method for programming multiple memory elements in multiple segments in a cell string with reduced program-disturb.

DETAILED DESCRIPTION

Exemplary embodiments of the present invention are described herein in the context of a process, device, method, and apparatus for providing a novel dual function hybrid memory cell.

Those of ordinary skill in the art will realize that the following detailed description is illustrative only and is not intended to be in any way limiting. Other embodiments of the present invention will readily suggest themselves to skilled persons having the benefit of this disclosure. Reference will now be made in detail to implementations of the exemplary embodiments of the present invention as illustrated in the accompanying drawings. The same reference indicators or numbers will be used throughout the drawings and the following detailed description to refer to the same or like parts.

It should be noted that the exemplary embodiments are not limited to ONO cells only and the disclosed aspects can be applied to other types of charge-trapping cells. To realize the low-cost, high-flexibility memory arrays using the disclosed ONO or other charge-trapping type of cells, the exemplary embodiments disclose a novel cell string and novel operating bias conditions. These embodiments and conditions allow novel cell strings and corresponding 3D NAND arrays to operate without experiencing program-disturb.

In various exemplary embodiments, a novel 3D array structure with divided cell string architecture is disclosed. For example, each cell string of a 3D NAND array includes internal select gates that divided the cell string into multiple segments. Each segment contains multiple memory cells. During programming, high voltage is applied only to the selected segment. The unselected segments remain at lower voltages; thus the program-disturb problem for unselected segments is reduced or eliminated.

Figures 3A, 3B:
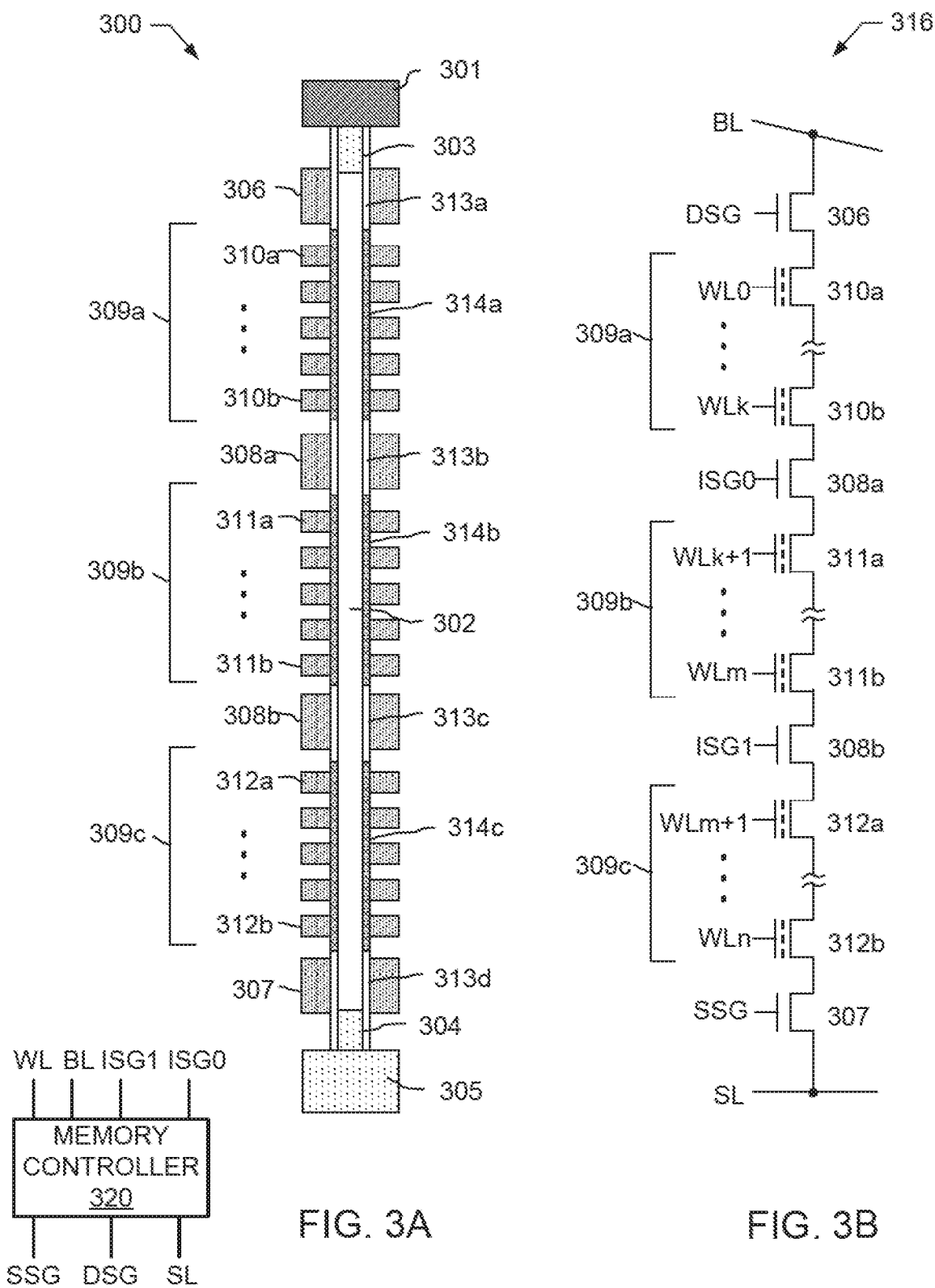
FIGS. 3A-B show exemplary embodiments of a divided linear cell string structure and an equivalent circuit in accordance with the present invention.

FIGS. 3A-B show exemplary embodiments of a divided linear cell string structure 300 and an equivalent circuit 316 in accordance with the present invention. As illustrated in FIGS. 3A-B, the 3D NAND cell string 300 comprises a metal bit line 301 and a polysilicon or silicon channel 302. Also shown are source 303 and drain 304 junctions that may have the opposite type of doping as the silicon channel 302. A polysilicon or silicon source line 305, a DSG 306, and a source select gate SSG 307 are also shown. The string 300 is divided into multiple segments 309a, 309b, and 309c by "internal select gates" 308a and 308b. In an exemplary embodiment, the internal select gates 308a and 308b are enhancement devices having channel lengths that are longer than the channels of the memory cells. The internal select gates 308a and 308b are connected to control signals ISG0 and ISG1, respectively, as shown in the circuit 316. In an exemplary embodiment, memory controller 320 operates to generate the control signals ISG0 and ISG1 as well as other memory control signals.

Figure 8:
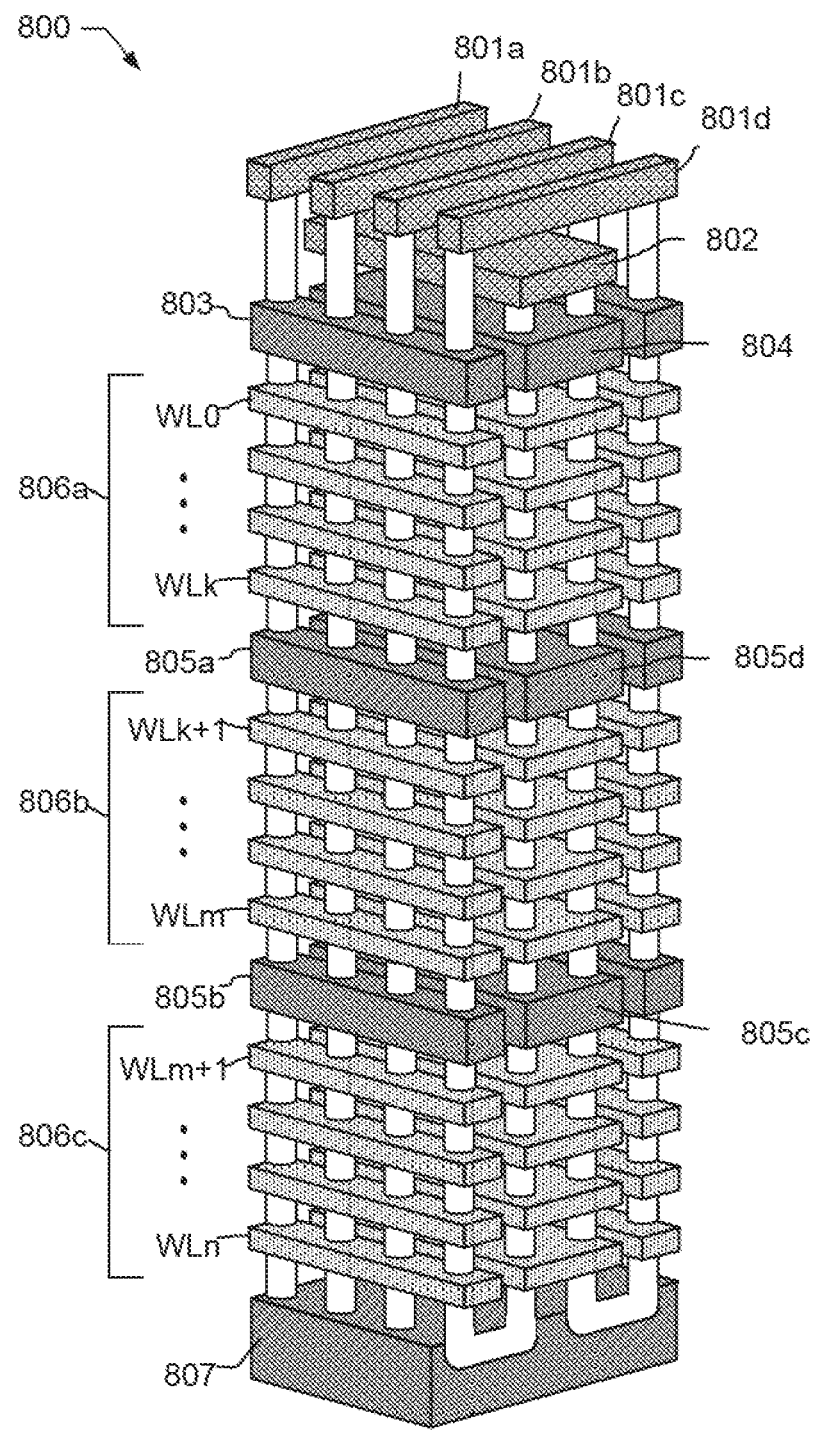
FIG. 8 shows an exemplary embodiment of a 3D NAND array structure constructed using the novel non-linear (U-shaped) cell string structure shown in FIG. 5A.

The first segment 309a contains multiple word lines, WL0 310a to WLk 310b. The second segment 309b contains WLk+1 311a to WLm 311b. The third segment 309c contains WLm+1 312a to WLn 312b. It should be noted that the segments 309a, 309b, and 309c may have the same or a different number of word lines (e.g., memory cells). The internal select gates 308a and 308b may have longer channel length than the memory cells to sustain high voltage during program operations. In an exemplary embodiment, the internal select gates 308a and 308b may be shared with the adjacent NAND strings, or decoded for each NAND string. For example, as shown in FIG. 8, internal select gate 805a can be used to control (divide) an individual cell string and internal select gate 805d is shared and can be used to control (divide) multiple cell strings. In addition, gate oxide layer 313a, 313b, 313c, and 313d and charge-trapping layers 314a, 314b, and 314c, such as ONO layers, are also shown.

It should also be noted that within the scope of the exemplary embodiments, the cell structures may be modified according to different process technologies. For example, in another embodiment, the cell string 300 may contain a "core" comprising an insulator layer such as oxide, or vacant space in the center of the channel. In another embodiment, the cell string 300 may use other NVM storage elements, such as floating gates (FG), Ferroelectric layer, resistive switching material, and/or other storage elements to store data. In another embodiment, the cell string 300 may contain multiple charge trapping layers such as Oxide-Nitride-Oxide-Nitride-Oxide (ONONO) or Oxide-Nitride-Oxide-Nitride (ONON) as storage elements. In another embodiment, the select gates 308a and 308b and the cells may be formed by 'junction-less' transistors, where the source and drain junctions 303 and 304 may be removed and the channel 302 is heavily doped. Moreover, the select gates 308*a* and 308*b* and memory cells may be formed by either PMOS or NMOS devices. A person skilled in the art would recognize these variations within the scope of the exemplary embodiments of the invention.

An advantageous feature of the exemplary 3D NAND cell string 300 is to reduce the program-disturb of the unselected cells. For example, assuming the segment 309*b* is selected for programming, after the bit line voltage is set, the selected word line will be supplied with a high program voltage such as +10V to +20V. The unselected word lines in the same segment will be supplied with an inhibit voltage such as +5V to +10V. The internal select gate 308*a* is supplied with VDD and internal select gate 308*b* is supplied with 0V. This prevents the high voltage in the channel of segment 309*b* from being passed to segments 309*a* and 309*c*. Thus, the word lines of the segments 309*a* and 309*c* can be floating at a lower voltage to reduce or eliminate program-disturb to memory elements in those segments.

The drain select gate 306, source select gate 307, and the word lines of the unselected segments 309*a* and 309*c* may be supplied with a proper voltage to pass (VDD or 0V) from the bit line, and VDD from the source line to the selected segment 309*b*. If the bit line voltage is 0V, it will discharge the channel of the segment 309*b* to 0V, thus the selected cell will be programmed. If the bit line voltage is VDD, it will turn off the internal select gate 308*a* to allow the channel of the segment 309*b* to be self-boosted to about +5V to +10V by the word lines of the segment 309*b*, and thus the selected cell is program-inhibited. The channel of the segment 309*c* may be supplied with VDD or a proper voltage from the source line to reduce the leakage current of the internal select gate 308*b*. It should be noted that in another embodiment, the unselected word lines of the segments 309*a* and 309*c* may be supplied with a medium high voltage to slightly boost the channel of the segments 309*a* and 309*c* for the case when the bit line is supplied with VDD. This may further reduce the leakage current of the internal select gates 308*a* and 308*b*.

Another advantage of the invention is that cells associated with multiple word lines and segments can be programmed simultaneously. For example, the program data may be supplied from the bit line to the segment 309*c*, and then the internal select gate 308*b* is turned off to isolate the segment 309*c*, while programming occurs. Then, second program data is supplied from the bit line to the second segment 309*b*, and then the internal select gate 308*a* is turned off to isolate the segment 309*b*, while programming occurs. Then, third program data is supplied from the bit line to the segment 309*a*. In this way, different data may be programmed to the cells of selected word lines of multiple segments simultaneously, thus reducing the programming time.

Another advantage of the invention is the multiple word line groups may be used as MOS capacitors to temporarily store the program data and read data, thus achieving multiple word lines' simultaneous programming or reading. In another embodiment, the multiple word line groups may use a Dynamic Random-Access Memory (DRAM) to store data as the charge in the channel of each word line groups.

According to another exemplary embodiment of the invention, the internal select gates (e.g., 308*a* and 308*b*) may be formed by two or more transistors connected in series. The gates of the transistors may be connected to the same or different control signals. This arrangement may have higher punch-through voltage and lower leakage current than a single transistor.

In one exemplary embodiment, the multiple layers of the 3D NAND string's pattern may be defined or formed by a single lithography step. For example, the holes for all the layers including drain select gates, word lines, internal select gates, and source select gates, etc. may be etched in one step. In another exemplary embodiment, the pattern may be defined and etched using multiple steps, such as using a first step to form the segment 309*c*, and a second step to form the segment 309*b*, and a third step to form the segment 309*a*.

FIGS. 4A-B show exemplary embodiments of a divided linear cell string structure 400 and an equivalent circuit 416 in accordance with the present invention. The 3D NAND cell string 400 is similar to the cell string 300 shown in FIG. 3A except that the gate dielectric layer of the internal select gates 308*a* and 308*b* is formed by the same charge trapping layer 314 as the cells. In an exemplary embodiment, this may reduce process steps during manufacture. However, during operations, the bias conditions should be carefully controlled to prevent unwanted programming of the internal select gates 308*a* and 308*b*. In another embodiment, the internal select gates 308*a* and 308*b* may be supplied with proper inhibit conditions during erase and program operations. In another embodiment, the voltage threshold (Vt) of the internal select gates 308*a* and 308*b* may be checked and erased or programmed back to the desired value.

Figure 5A:
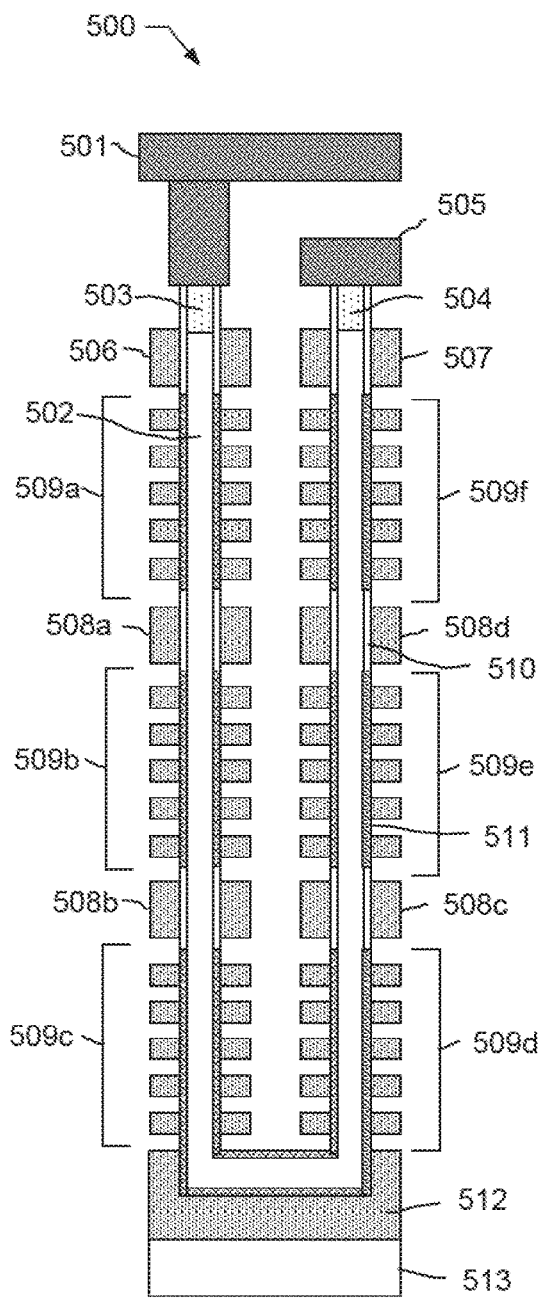
FIGS. 5A-B show exemplary embodiments of a divided non-linear cell string structure constructed using a folded 'U' shape string and an equivalent circuit in accordance with the present invention.
Figure 5B:
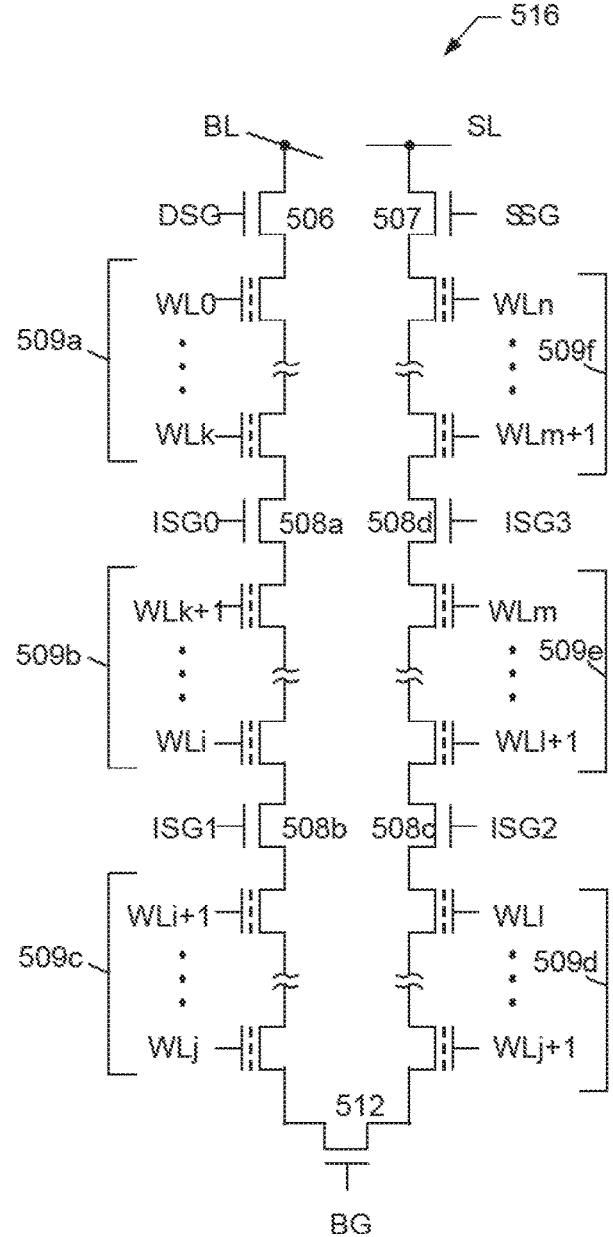

FIGS. 5A-B show exemplary embodiments of a divided non-linear cell string structure 500 constructed using a folded 'U' shape string and an equivalent circuit 516 in accordance with the present invention. The 3D NAND cell string 500 comprises a metal bit line 501 and a polysilicon or silicon channel 502. Also shown are source 503 and drain 504 junctions that may have the opposite type of doping as the channel 502. A metal source line 505, drain select gate (DSG) 506, and source select gate (SSG) 507 are also shown. The string 500 is divided into multiple segments 509*a*, 509*b*, 509*c*, 509*d*, 509*e*, and 509*f* by "internal select gates" 508*a*, 508*b*, 508*c*, and 508*d*. The internal select gates 508*a*, 508*b*, 508*c*, and 508*d* are connected to control signals ISG0, ISG1, ISG2 and ISG1, respectively. The first segment 509*a* contains multiple word lines, WL0 to WLk. The second segment 509*b* contains word lines WLk+1 to WLi, and so forth. It should be noted that the segments may have the same or different number of word lines. The internal select gates 508*a*, 508*b*, 508*c*, and 508*d* may have longer channel lengths than the memory cells to sustain high voltage during program operations. The internal select gates 508*a* to 508*d* may be shared with the adjacent NAND strings, or decoded for each NAND string. The internal select gates may have an oxide layer as the gate dielectric, as shown 510. Charge-trapping layers 511 comprise, for example, ONO layers.

Figures 6A, 6B:
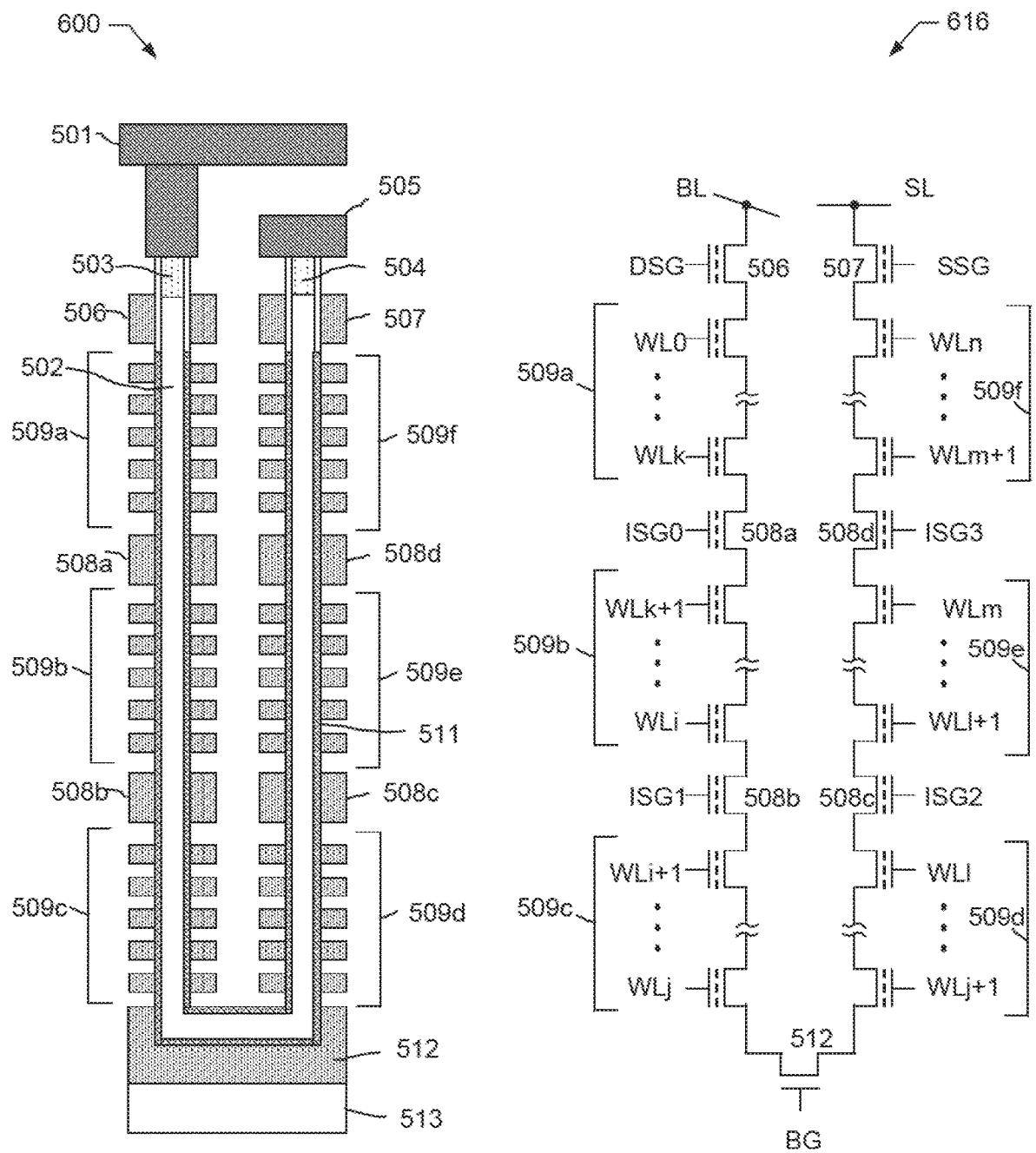
FIGS. 6A-B show exemplary embodiments of a divided non-linear cell string structure constructed using a folded 'U' shape string and an equivalent circuit in accordance with the present invention.

FIGS. 6A-B show exemplary embodiments of a divided non-linear cell string structure 600 constructed using a folded 'U' shape string and an equivalent circuit 614 in accordance with the present invention. As illustrated in FIG. 6A the cell string 600 is similar to the cell string 500 shown in FIG. 5A except that the gate dielectric layer of the internal select gates 508*a*, 508*b*, 508*c*, and 508*d* is formed by the same charge trapping layer 511 as the cells. In an exemplary embodiment, this may reduce process steps during manufacture. Thus, there are many other cell string structures that may be used to implement the multiple word line groups described herein. A person skilled in the art would recognize that these variations are within the scope of the exemplary embodiments.

Figure 7:
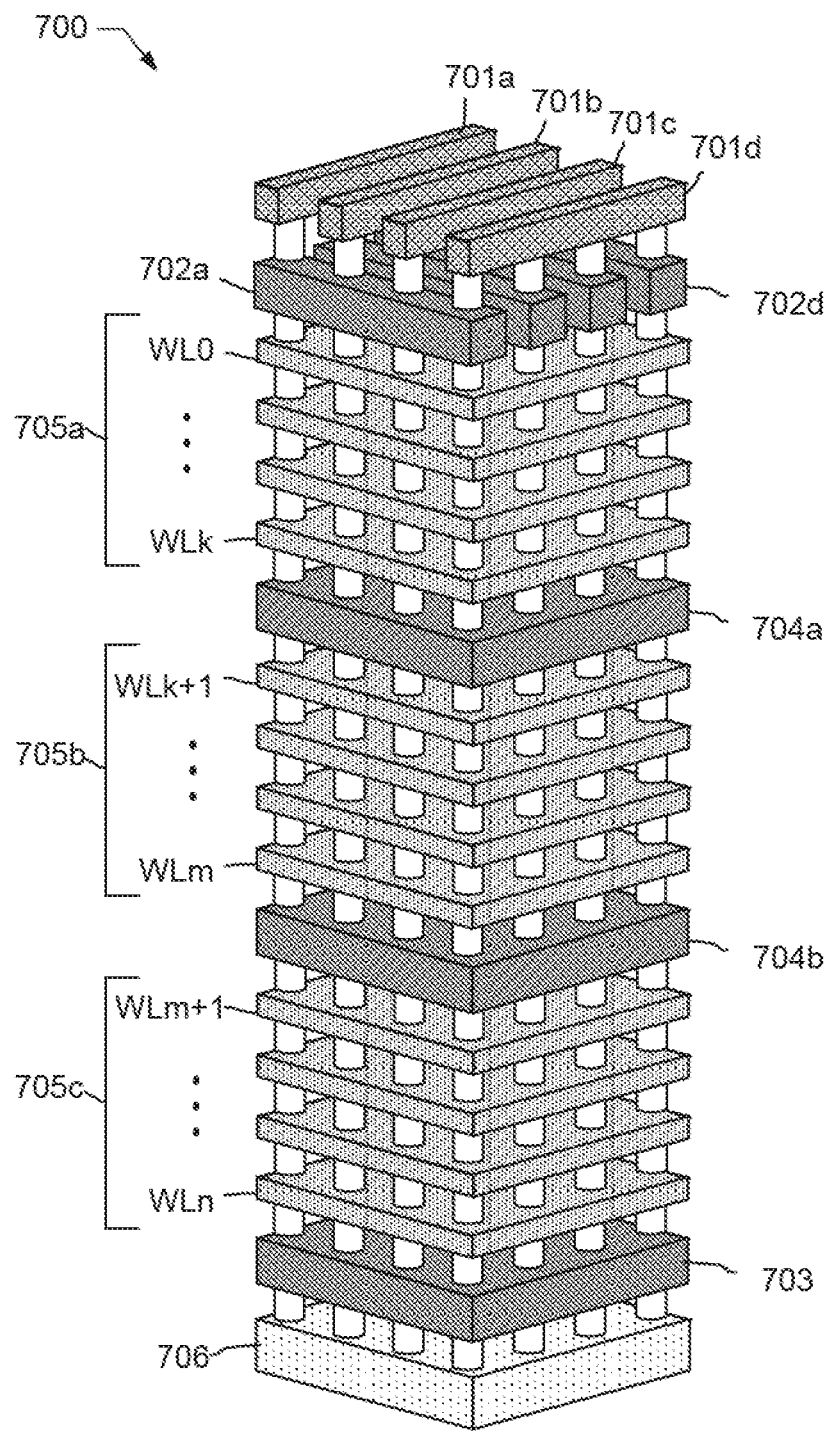
FIG. 7 shows an exemplary embodiment of a 3D NAND array structure constructed using the novel linear cell string shown in FIG. 3A.
Figure 9:
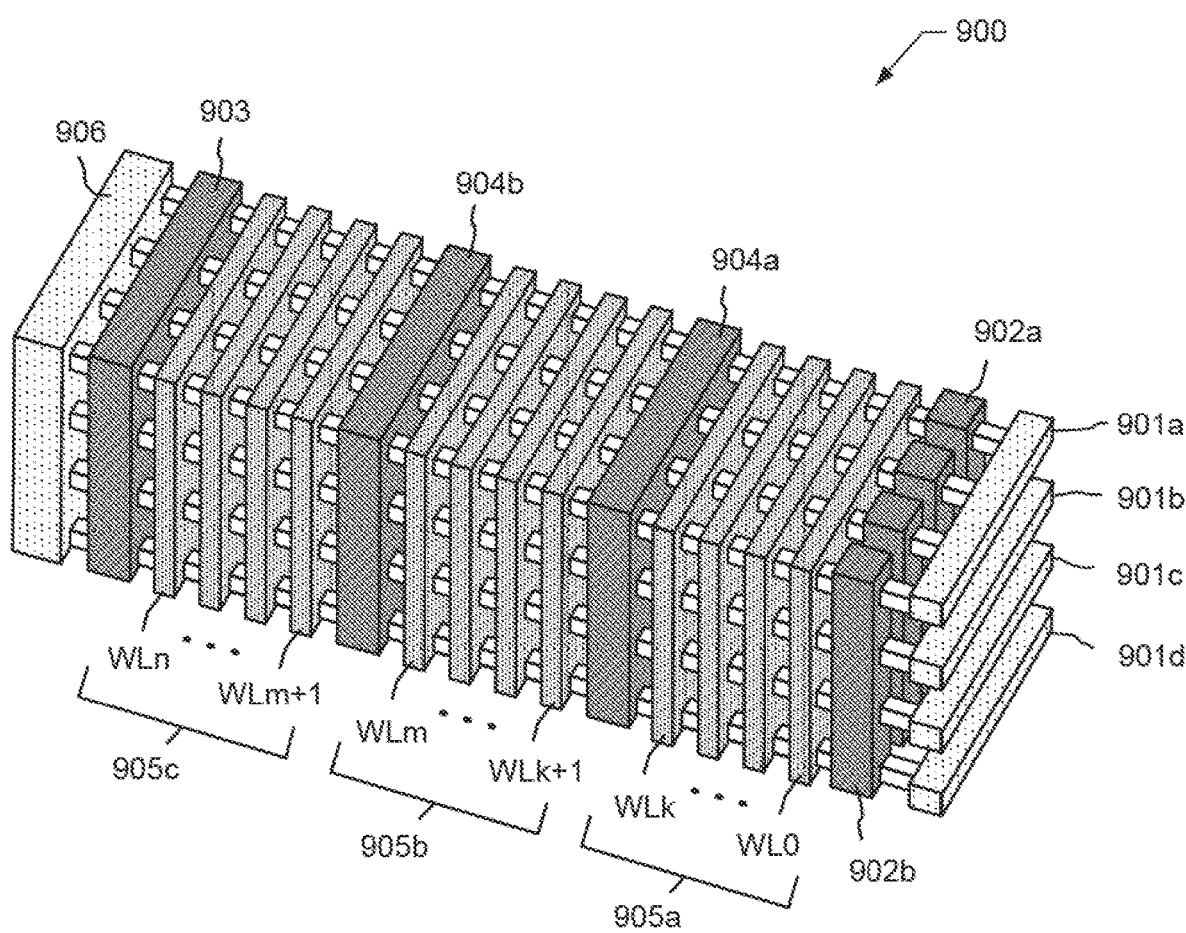
FIG. 9 shows an exemplary embodiment of a 3D NAND array structure constructed using horizontal cell strings comprising the novel linear cell string structure shown in FIG. 3A.

FIGS. 7-9 show exemplary embodiments of 3D NAND array architectures comprising exemplary embodiments of divided cell string structures in accordance with the present invention.

FIG. 7 shows an exemplary embodiment of a 3D NAND array structure 700 constructed using the novel linear cell string structure 300 shown in FIG. 3A. The array structure 700 comprises metal bit lines 701a, 701b, 701c, and 701d, drain select gates (e.g., 702a through 702d), source select gate 703 and source line 706. Also shown are internal select gates 704a and 704b. The internal select gates 704a and 704b divide the word lines into multiple segments 705a, 705b, and 705c. It should also be noted that each of the internal select gates 704a and 704b are shared by multiple cell strings. Thus, the novel linear cell string structure 300 allows the segments of the 3D NAND array 700 to be programmed while reducing or eliminating program-disturb for the unselected segments.

FIG. 8 shows an exemplary embodiment of a 3D NAND array structure 800 constructed using the novel non-linear (U-shaped) cell string structure 500 shown in FIG. 5A. The array structure 800 comprises metal bit lines 801a, 801b, 801c, and 801d, a metal source line 802, drain select gate 803, source select gate 804, and back gate 807. Also shown are internal select gates 805a, 805b, 805c, and 805d that divide the word lines into multiple segments indicated at 806a, 806b, and 806c. Thus, the novel non-linear cell string structure 500 allows the segments of the 3D NAND array 800 to be programmed while reducing or eliminating program-disturb for the unselected segments.

FIG. 9 shows an exemplary embodiment of a 3D NAND array structure 900 constructed using horizontal cell strings comprising the novel linear cell string structure 300 shown in FIG. 3A. The array structure 900 comprises polysilicon bit lines 901a, 901b, 901c, and 901d, drain select gates (e.g., 902a through 902d), source select gate 903, source line 906, and internal select gates 904a and 904b. The internal select gates 904a and 904b divide the word lines (of the cell strings) into multiple segments indicated at 905a, 905b, and 905c. Thus, the novel linear cell string structure 300 allows the segments of the 3D NAND array 900 to be programmed while reducing or eliminating program-disturb for the unselected segments.

FIG. 10 shows an exemplary embodiment of method 1000 for programming memory cells in a segment of a cell string with reduced program-disturb. For example, the method is suitable for use with the novel cell strings shown in FIGS. 3-6 and with the 3D NAND devices shown in FIGS. 7-9.

At block 1002, a segment of a cell string formed by internal select gates and containing a memory cell to be programmed is determined. For example, as illustrated in FIG. 3A, the segment 309c containing memory cell 312a is to be programmed.

At block 1004, drain select gate (DSG), source select gate (SSG) and internal select gate (ISG) voltages are set. For example, in an exemplary embodiment, the DSG 306 is set to VDD, SSG 307 is set to 0 volts and the ISG0 and ISG1 are set to VDD. In an embodiment, the controller 320 sets these voltages.

At block 1004, a bit line voltage is set. For example, in an exemplary embodiment, the bit line 301 is set to either VDD for inhibit or zero volts for program. In an embodiment, the controller 320 sets the bit line voltage.

At block 1008, word line voltages are ramped up. For example, the selected word line WLm+1 is set to approximately 20 volts and the unselected word lines WLm+2 to WLn are set to approximately 10 volts. This begins the programming of the memory cell 312a.

At block 1010, the voltage on the ISG1 is set to zero. For example, the controller 320 set the voltage ISG1 to zero. This isolates the segment 309c from the other segments.

Thus, during the programming of memory element 312a, memory elements in segments 309a and 309b are protected from the effects of program-disturb.

Thus, the method 1000 operates to program memory cells in a segment of a cell string with reduced program-disturb. It should be noted that the method 1000 is exemplary and that the disclosed operations may be combined, rearranged, added to, deleted, and/or modified within the scope of the embodiments.

FIG. 11 shows an exemplary embodiment of method 1100 for programming memory cells in multiple segments of a cell string with reduced program-disturb. For example, the method is suitable for use with the novel cell strings shown in FIGS. 3-6 and with the 3D NAND devices shown in FIGS. 7-9.

Blocks 1102 through 1110 are identical to the blocks 1002 through 1010 shown in FIG. 10 and so their description will not be repeated here. At the end of block 1110, the memory cell 312a in segment 309c is being programmed and the internal select gate 308b is turned off. The method now continues at block 1112.

At block 1112, a segment of a cell string formed by internal select gates and containing a memory cell to be programmed is determined. For example, as illustrated in FIG. 3A, the segment 309b containing memory cell 311a is to be programmed. It should be noted that at this point the internal select gate ISG0 is turned on to allow the bit line voltage to pass to the segment 309b. If, however, it is desirable to program a cell in segment 309a, the internal select gate ISG0 can be turned off.

At block 1114, a bit line voltage is set. For example, in an exemplary embodiment, the bit line 301 is set to either VDD for inhibit or zero volts for program. In an embodiment, the controller 320 sets the bit line voltage.

At block 1116, word line voltages are ramped up. For example, the word line WLk+1 is set to approximately 20 volts and the word lines WLk+2 to WLm are set to approximately 10 volts. This begins the programming of the memory cell 311a. Note that since the programming operation takes far longer than the biasing operation described, the biasing operation is quickly completed and thus both memory elements 312a and 311a continue to be programmed essentially simultaneously.

At block 1118, the voltage on the ISG0 is set to zero. For example, the controller 320 set the voltage ISG0 to zero. Thus, during the programming of memory element 311a, memory elements in segments 309a are protected from the effects of program-disturb.

Thus, the method 1100 operates to program multiple memory cells in multiple segments of a cell string with reduced program-disturb. It should be noted that the method 1100 is exemplary and that the disclosed operations may be combined, rearranged, added to, deleted, and/or modified within the scope of the embodiments.

Figure 12:
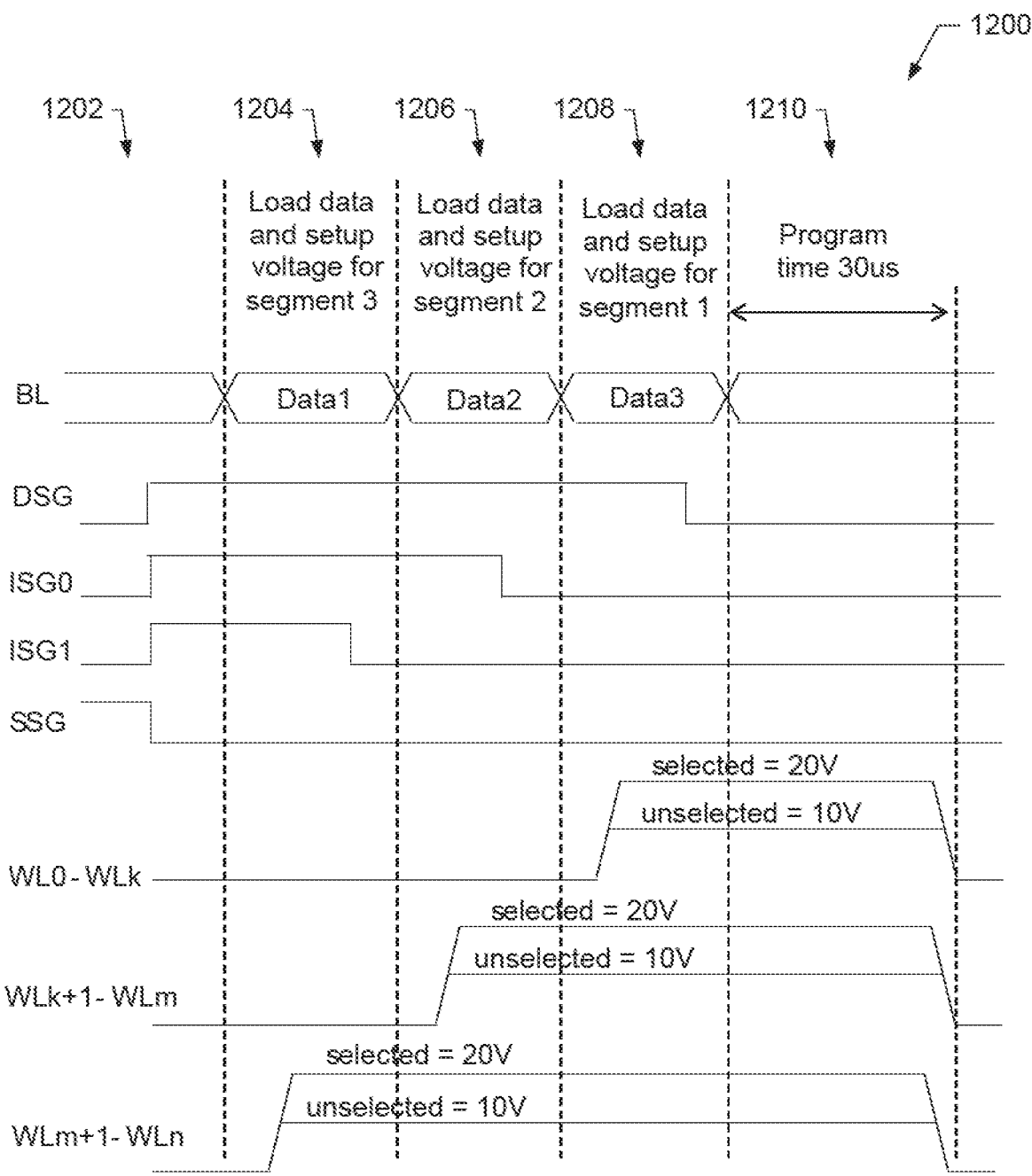
FIG. 12 shows an exemplary timing diagram illustrating signal timing waveforms to program multiple memory elements in multiple segments in a cell string with reduced program-disturb.

FIG. 12 shows an exemplary timing diagram 1200 illustrating signal timing waveforms to program multiple memory elements in multiple segments in a cell string with reduced program-disturb. For example, signal timing shown in the diagram 1200 is suitable for use to program multiple cells in multiple segments of the cell string structure shown in FIGS. 3A-B. In an exemplary embodiment, the memory controller 320 sets the signal line voltages as described below.

At a first timing interval shown at 1202, the DSG, ISG0, ISG1 are set to VDD volts, and the SSG, and word lines (WL0-WLn) are set to zero volts. This initializes the cell string for programming.

At a second timing interval shown at 1204, data (Data1) is loaded for programming into the third segment 309c. For example, the bit line data is set to the appropriate value (Data1) and the word lines for the third segment (WLm+1-WLn) are set to either the selected (20) or unselected (10) voltage level. This begins the programming of the selected cells in the third segment. The voltage on ISG1 is then set to zero voltage to isolate the third segment from the remaining segments.

At a third timing interval shown at 1206, data (Data2) is loaded for programming into the second segment 309b. For example, the bit line data is set to the appropriate value (Data2) and the word lines for the second segment (WLk+1-WLm) are set to either the selected (20) or unselected (10) voltage level. This begins the programming of the selected cells in the second segment. The voltage on ISG0 is then set to zero voltage to isolate the second segment from the remaining segments.

At a fourth timing interval shown at 1208, data (Data3) is loaded for programming into the first segment 309a. For example, the bit line data is set to the appropriate value (Data3) and the word lines for the first segment (WL0-WLk) are set to either the selected (20) or unselected (10) voltage level. This begins the programming of the selected cells in the first segment. The voltage on DSG is then set to zero.

At a fifth timing interval shown at 1210, simultaneous programming of the cells in the three segments continues for approximately 30 microseconds (us).

Thus, the exemplary timing diagram 1200 illustrating signal timing waveforms to program multiple bits in multiple segments of a novel cell string structure in accordance with the present invention. It should be noted that the signal timing and voltage levels disclosed are exemplary and not limiting of the embodiments of the invention. It should also be noted that multiple segments can be programmed without programming all segments. For example, modifications to the above signal timing can be made to program segment 3 and segment 1 or to program segment 2 and segment 1.

It should be noted that the voltage values shown in the description and figures are exemplary and do not limit the described voltages to exact voltage values. It is obvious that the actual voltages used depend on the technology, process, and/or other factors. It should also be noted that the disclosed cells and bias conditions can be utilized with any type of array structures and that the bias conditions are not limited to specific array types.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A method for programming memory cells of a cell string having one or more internal select gates that divide the cell string into segments, comprising:
    setting the one or more internal select gates to enable a memory cell in a first segment of the cell string to be programmed;
    applying first data to a bit line of the cell string;
    ramping up a selected word line of the first segment to a first voltage and unselected word lines of the first segment to a second voltage, wherein programming of the first data into the memory cell in the first segment begins;
    setting the one or more internal select gates to isolate the first segment and to enable a memory cell in a second segment of the cell string to be programmed;
    applying second data to the bit line of the cell string;
    ramping up a selected word line of the second segment to the first voltage and unselected word lines of the second segment to the second voltage, wherein programming of the second data into the memory cell of the second segment begins; and
    wherein the programming of the memory cell in the first segment and the programming of the memory cell in the second segment overlap for a selected time interval.

2. The method of claim 1, further comprising applying a source select gate voltage to a source select gate of the cell string.

3. The method of claim 2, wherein the source select gate voltage is zero volts.

4. The method of claim 1, further comprising applying a drain select gate voltage to a drain select gate of the cell string.

5. The method of claim 4, wherein the drain select gate voltage is VDD.

6. The method of claim 1, wherein the first voltage is 20 volts.

7. The method of claim 1, wherein the second voltage is in the range of 8 to 10 volts.

8. The method of claim 1, wherein the operation of setting the one or more internal select gates to isolate the first segment prevents program-disturb.

9. The method of claim 1, wherein the bit line is coupled to a first end of the second segment and a selected internal select gate connects a second end of the second segment to the first segment.

10. The method of claim 1, further comprising:
    setting the one or more internal select gates to isolate the second segment;
    applying third data to the bit line of the cell string;
    ramping up a selected word line of a third segment to the first voltage and unselected word lines of the third segment to the second voltage, wherein programming of a memory cell in the third segment begins, and wherein the programming of the memory cells in the first, second, and third segments overlap for a selected time interval.

11. The method of claim 10, wherein the operation of setting the one or more internal select gates to isolate the second segment comprises setting an internal select gate voltage of a selected select gate to zero volts.

12. The method of claim 10, wherein the bit line connects to the third segment and a selected internal select gate connects a second end of the third segment to the second segment.

13. The method of claim 12, wherein a second selected internal select gate connects the second segment to the first segment.

* * * * *